United States Patent [19]

Behfar-Rad et al.

[11] Patent Number: 5,532,608
[45] Date of Patent: Jul. 2, 1996

[54] CERAMIC PROBE CARD AND METHOD FOR REDUCING LEAKAGE CURRENT

[75] Inventors: Abbas Behfar-Rad, Poughquag; Charles H. Perry, Poughkeepsie; Krishna G. Sachdev, Hopewell Junction, all of N.Y.

[73] Assignee: International Business Machines Corporation, Armonk, N.Y.

[21] Appl. No.: 417,623

[22] Filed: Apr. 6, 1995

[51] Int. Cl.$^6$ .................................................. G01R 15/12
[52] U.S. Cl. .......................................... 324/754; 324/72.5
[58] Field of Search ...................................... 324/754, 755, 324/760, 762, 72.5; 439/482; 428/325, 405, 422, 901, 412; 174/68.5; 29/832, 876; 527/201, 203

[56] References Cited

U.S. PATENT DOCUMENTS

| | | | |
|---|---|---|---|
| 4,623,839 | 11/1986 | Garretson et al. | 324/762 |
| 4,757,256 | 7/1988 | Whann et al. | 324/758 |
| 4,849,284 | 7/1989 | Arthur et al. | 428/325 |
| 5,124,639 | 6/1992 | Carlin et al. | 324/760 |
| 5,134,365 | 7/1992 | Okubo et al. | 324/758 |
| 5,148,103 | 9/1992 | Pasiecznik, Jr. | 324/758 |
| 5,254,411 | 10/1993 | Takeda et al. | 428/447 |
| 5,290,606 | 3/1994 | Hestevik et al. | 427/453 |
| 5,313,157 | 5/1994 | Pasiecznik, Jr. | 324/757 |
| 5,352,491 | 10/1994 | Cifuentes et al. | 427/387 |

*Primary Examiner*—Vinh P. Nguyen
*Attorney, Agent, or Firm*—Peter W. Peterson; Delio & Peterson; Steven J. Soucar

[57] ABSTRACT

An electrical probe card for parametric testing of microelectronics having reduced leakage current, includes a hydrophobic layer of a self curing silicone material coating the entire exposed surface of the ceramic card between exposed conductors. The hydrophobic layer has a thickness of less than 1 micrometer, preferably less than 0.1 micrometer and most preferably between 0.01 and 0.001 micrometers. The hydrophobic layer does not interfere with subsequent soldering to the contacts on the card, is inexpensive, solvent resistant and easily applied to new and pre-existing probe cards. The method of application involves applying an excess of the hydrophobic silicone material in its uncured state, followed by vigorously wiping excess material off to thin the layer, produce a good bond and clean the exposed conductors on the probe card.

21 Claims, 2 Drawing Sheets

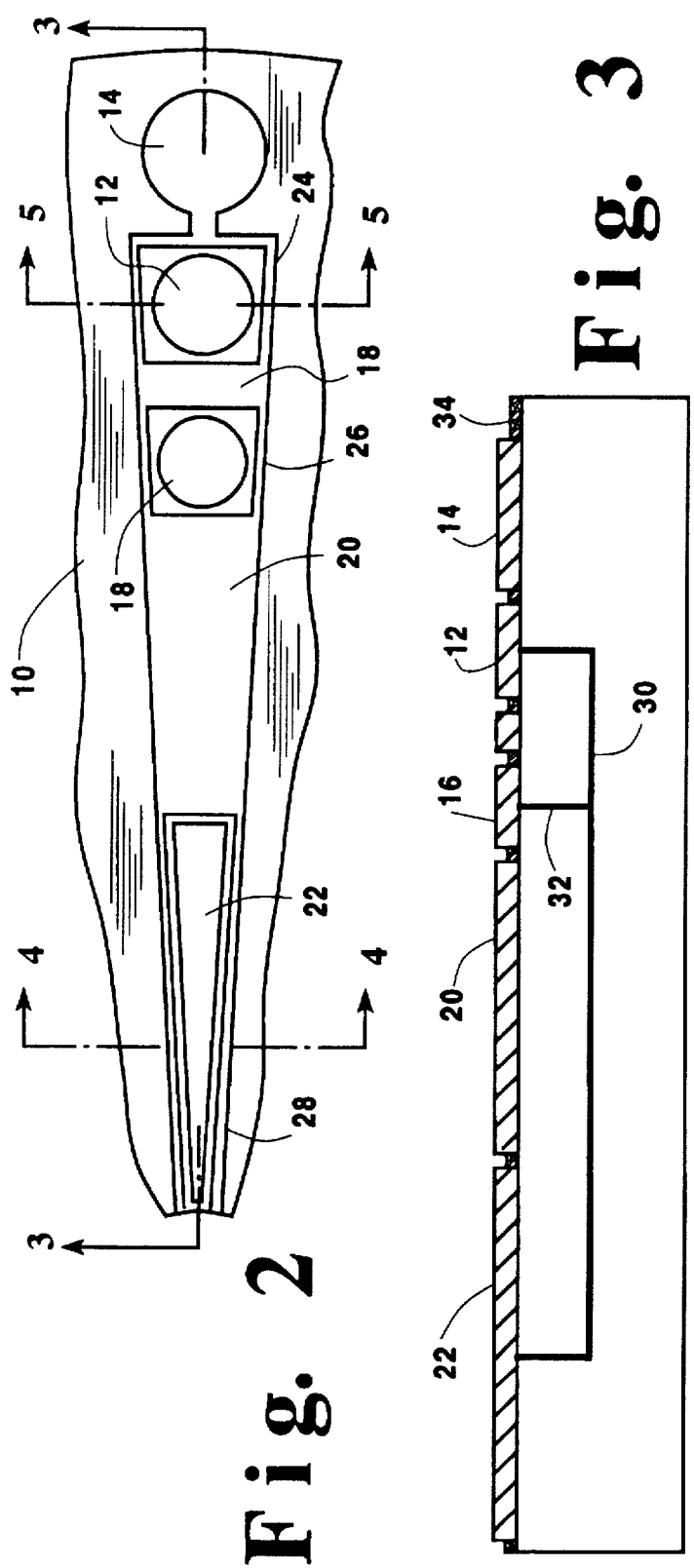

5,532,608

CERAMIC PROBE CARD AND METHOD FOR REDUCING LEAKAGE CURRENT

BACKGROUND OF THE INVENTION

1. Field of the Invention

This invention relates to probe cards used in the precision testing of microelectronics. More particularly, the invention relates to ceramic probe cards and methods of treating such cards to minimize leakage current between electrical conductors on the surface of the card.

2. Description of Related Art

Probe cards are used in the testing of micro-electronic devices, particularly for in line parametric testing during the manufacture of such devices, to monitor diffusion depths and other critical parameters. The probe card typically provides multiple channels, defined by corresponding conductors, each channel carrying a signal between test instrumentation and a probe that contacts a point on the device under test. The tests may require that current levels be measured to an accuracy on the order of ten femtoamps ($10^{-14}$ amps), or less.

To make such accurate measurements, current leakage on the probe card must be reduced to correspondingly low levels, and a number of techniques for leakage current reduction are known. A basic technique is to construct the probe card of a material that inherently has good electrical insulating properties. Ceramic is such a material, however, leakage current between adjacent electrical conductors on a ceramic card having no specialized shielding may be as high as 10 picoamps ($10^{-11}$ amps). This is several orders of magnitude too high. Thus, despite the excellent insulating properties of ceramic, additional steps must be taken to minimize leakage current.

One such technique that provides significant reduction in leakage current is the use of active guard technology in which conductors on the surface of the ceramic probe card are surrounded with active guard shielding. The conductors being shielded are referred to as the "force" conductors. The conductors doing the shielding are referred to as the "guard" conductors.

Unlike conventional shielding where the shield conductors are grounded, in active guard technology the guard conductors are held at a voltage that is identical to the voltage on the force conductors that they are guarding. This arrangement produces an equipotential surface in the vicinity of each force conductor which inhibits the flow of leakage current. Using this technology, leakage may be reduced to levels on the order of 0.1 picoamps ($10^{-13}$ amps), however, for some tests that it is desirable to make, this is still too high.

The present invention addresses the leakage current problem on prior art ceramic probe cards having active guard shielding and results from a careful investigation of the source of the remaining leakage. Without intending to be limited by any theory of operation of the present invention, it appears that much of the remaining leakage current arises from atmospheric humidity that produces a current path on the surface of the ceramic card. The present invention addresses this problem by providing a ceramic probe card which has a hydrophobic moisture repelling material bonded to the surface of the ceramic between the electrical conductors.

Problems can arise, however, whenever the ceramic surface interface is coated with an additional material. Contaminants on a prior art ceramic probe card surface, for example, can increase leakage current drastically. Consequently, any intentionally added hydrophobic coating material must be an excellent electrical insulator and/or be capable of being applied in extremely thin layers to avoid producing an additional conductive path. Also, the coating must be capable of surviving subsequent exposure to hot solvents, soldering resins and heat to which the ceramic surface may be subjected, but must not interfere with soldering to the conductors. Preferably the additional material should strongly adhere to the ceramic surface and yet be easily removed from the conductors. If the additional material lacks this property it must be very carefully applied only to the exposed ceramic surface between closely spaced conductors, leading to a very expensive and difficult application step.

Bearing in mind the problems and deficiencies of the prior art, it is therefore an object of the present invention to provide a ceramic electrical probe card in which leakage currents have been reduced to very low levels.

It is yet another object of the present invention to provide a ceramic probe card in which the leakage has been reduced through the use of an easily applied hydrophobic material.

Still another object of the present invention is to provide a hydrophobic material which is inexpensive and which is applied in extremely thin layers to the ceramic probe card.

It is still another object of the present invention to provide a method of treating ceramic probe cards after construction to significantly reduce leakage currents.

It is a further object of the invention to provide a ceramic probe card with an applied hydrophobic material reducing current leakage to very low levels which is solvent resistant and stable at high temperatures.

It is yet another object of the invention to provide a hydrophobic material which can be applied to the ceramic surface and be easily removed from the conductors to avoid interfering with subsequent soldering operations.

SUMMARY OF THE INVENTION

The present invention comprises a ceramic probe card having a ceramic substrate with an exposed ceramic surface. The ceramic surface has a plurality of electrical conductors thereon. Typically these conductors include contact pads, shielding conductors and various wires between the same. In the preferred design, there are multiple channels on the card, each channel including a force contact pad, a sense contact pad and a guard contact pad, and various conductors connected to these contact pads for carrying the signal and performing guarding and sensing operations.

A coating of hydrophobic material is applied to the ceramic surface between the electrical conductors. The preferred hydrophobic material is silicone based, preferably a moisture activated single component silicone. Such materials are widely sold as silicone sealants, self curing silicone rubbers and gasketing materials. Generally, they comprise acyloxy activated/silanol terminated poly-methylalkyl siloxane with silica and iron oxide fillers. A particularly suitable material is a high temperature silicone intended for use as a sealant at temperatures up to 300° C. (650° F.) that is sold under the brand name "Permatex".

The hydrophobic material is preferably obtained in a colored paste or thick liquid form and is applied in a layer that is less than one micrometer in thickness, and most preferably in the range of 0.1 to 0.001 micrometers in thickness. The most highly preferred embodiment of the invention utilizes a layer of hydrophobic material that is approximately 0.004 micrometers in thickness to produce a probe card having a leakage current as low as 5 to 10 femtoamps.

After application of the hydrophobic material it is allowed to self cure in the air, preferably at an elevated temperature above 100° C., and most preferably at a first elevated temperature above 100° C. followed by a period of time at a second elevated temperature above 200° C. The preferred hydrophobic material is resistant to solvents, including hot xylene, as the probe card may be subjected to such solvents during subsequent soldering steps.

The present invention is also directed to a method for reducing surface leakage current on a preexisting ceramic probe card by applying the hydrophobic silicone based material to the ceramic surfaces located between electrically conductive pads on the ceramic probe card. The preferred method of application is to apply an excess of the hydrophobic material to substantially all ceramic surfaces, followed by mechanically removing the majority of the hydrophobic material to leave a residue thickness of less than 0.1 micrometers. The application step is then followed by a curing step, preferably in air and in two stages, first at an elevated temperature above 100° C. followed by a period of time at a second elevated temperature above 200° C.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 2 is a top plan view of a portion of the ceramic probe card in FIG. 1 illustrating the conductors of a single channel.

FIG. 3 is a cross sectional view of the present invention, not to scale, taken along the line 3—3 of FIG. 2.

FIG. 4 is a cross sectional view of the present invention, not to scale, taken along the line 4—4 of FIG. 2.

FIG. 5 is a cross sectional view of the present invention, not to scale, taken along the line 5—5 of FIG. 2.

DESCRIPTION OF THE PREFERRED EMBODIMENT

Figure 1:
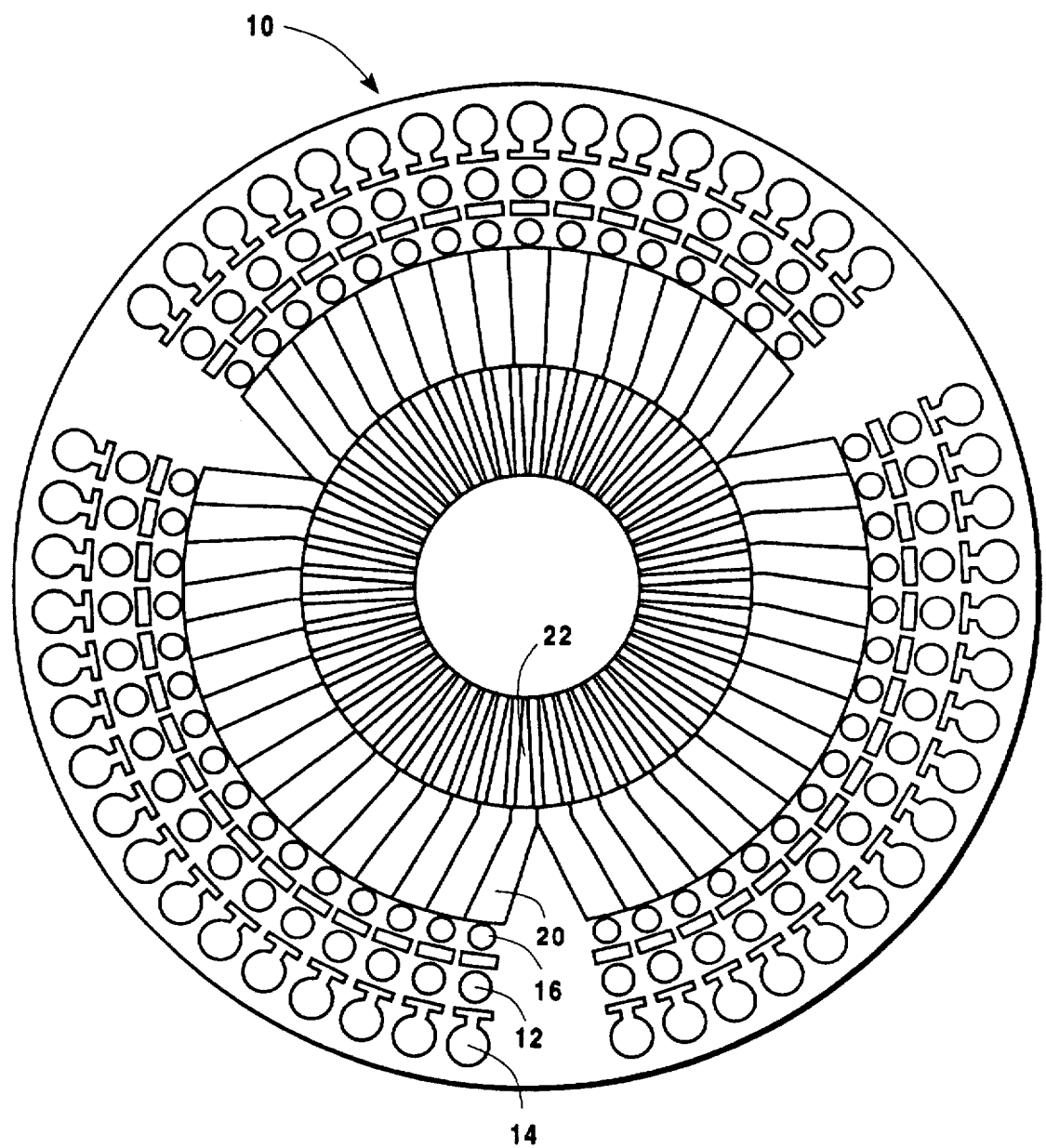
FIG. 1 is a top plan view of a multiple channel ceramic probe card in accordance with the present invention.

FIG. 1 illustrates a ceramic probe card 10 constructed in accordance with the present invention. The sample probe card illustrated includes 48 individual channels arranged in three groups of 16 channels. Other arrangements of channels and conductors may also be employed; Each channel on the probe card of FIG. 1 includes three main conductors, with a contact pad for making connection to each. These include a force contact pad 12, a guard contact pad 14 and a sense contact pad 16.

FIG. 2 provides an enlarged view of the conductors of a single channel. As can be seen there, the guard contact pad 14 is connected to additional conductors 18, 20, 24, 26 and 28 which entirely surround the force and sense contact pads. These guard conductors include the relatively large conductive regions 18 and 20 as well miscellaneous connecting wires 24, 26 and 28 that act to provide an equipotential surface around the force and sense conductors. As is described below, the sense and force contact pads are connected together and have approximately the same voltage on them. The guard contact pad is driven to the same voltage, and the local equipotential surface produced strongly (but not completely) inhibits the flow of leakage current.

As may be seen in the cross sectional view of FIG. 3, the force contact pad 12 (which carries the test signal) is internally connected through wire 30 to a further triangular contact pad 22. Contact pad 22 usually has a probe soldered to it (not shown here) which then makes contact with the device under test. The device under test is brought up under the center of the card and into contact with the tips of the probes from the various channels projecting below the card.

As may be further seen in FIG. 3, the sense conduct pad 16 is also connected to triangular contact pad 22 via wire 32. As is known in the art, the sense connection is provided to monitor the exact voltage that appears on the triangular contact pad 22. The force contact pad is connected to test instrumentation that may be providing a significant current to the device under test. This current may produce a resistive voltage drop between the test instrumentation and the probe card. The sense contact pad is used to monitor the actual voltage appearing at the probe so that any voltage drop can be compensated by adjusting the driving voltage at the test instrumentation, as needed, to produce the exact desired voltage at the probe.

As may be seen in FIGS. 3, 4 and 5, in order to further reduce leakage current, the ceramic surface of the probe card 10 that is exposed to the air is coated with a layer of a hydrophobic material 34. The hydrophobic material is applied over substantially the entire exposed surface of the ceramic including between the force and sense contact pads and their surrounding guard conductors, as well on the surface of the ceramic between adjacent channels.

Although FIGS. 3, 4 and 5 are not drawn to scale, it can be seen from these drawings that in the preferred design the hydrophobic material 34 is left with a thickness which is significantly less than the thickness of the contact pads. Contact pads in the preferred design have a thickness of 10 to 15 micrometers, whereas the thickness of the hydrophobic material is preferably one micrometer or less. More preferably, the hydrophobic material 34 has a thickness of less than 0.1 micrometers and in the most highly preferred embodiment the thickness is reduced to 0.004 micrometers.

FIGS. 4 and 5, provide cross sections through the triangular contact pad 22 and the force contact pad 12, respectively. These drawings illustrate the guard wires 24 and 28 that appear on each side of the conductors and the hydrophobic material 34 that is applied on all exposed surfaces of the ceramic.

The particular layout of the conductors on the surface of the ceramic is not critical to the present invention provided that conventional design techniques are employed to minimize leakage current through the use of active guard technology. The preferred material for producing the hydrophobic layer 34 is silicone based, preferably a moisture activated single component silicone rubber. Suitable materials are available in thick liquid and paste form and are sold for use as self curing silicone sealants, silicone rubbers, gasketing materials and the like. A preferred material is sold under the brand name "Permatex" by the Loctite Corporation of Cleveland, Ohio, Part No. 26B, Item #81164. This material is widely sold to the general public in automotive stores for use as a self curing high temperature (up to 300° C.) silicone based automotive gasketing material.

Suitable hydrophobic materials include moisture-activated single component silicone coatings of the type sold under the trademark RTV (room temperature vulcanizing). More specifically, the coatings should confer permanent hydrophobicity to the ceramic surface, be thermally stable to at least 300° C. and be solvent resistant. Generally, these materials comprise crosslinkable polydialkylsiloxanes (e.g., OH terminated PDMS) in conjunction with low molecular weight siloxanes having hydrolyzable end cappers such as acetate, and include inorganic fillers.

The present invention also relates to the method for reducing surface leakage current on a ceramic probe card. The method may be used during initial construction of the ceramic probe card or to decrease the leakage current and improve the performance of a previously manufactured ceramic probe card.

A preliminary step is to thoroughly clean the ceramic probe card surface using conventional mechanical and/or chemical cleaning techniques. The particular method is not important as long as the conductors are not damaged and the surface is thoroughly clean and devoid of grease, oils or other contaminants. The hydrophobic material should then be applied to the surface of the ceramic to be covered. The preferred hydrophobic material is the self curing silicone material in paste or liquid form having the solvent resistance, high temperature and other advantageous properties described above. However, any hydrophobic material that can be applied to the ceramic surface without introducing a conduction path will provide some decrease in leakage current.

Generally, the entire exposed surface of the ceramic should be covered with an excess of the hydrophobic silicone material in its uncured state. It is particularly important to produce a continuous coating of hydrophobic material between conductors to break conductive paths that may form on the surface of the ceramic, and less important to cover regions that are remote from the conductors or that do not lie directly between nearby conductors. However, it is preferred to thoroughly coat all exposed surfaces of the ceramic and leave no exposed areas.

Suitable hydrophobic silicone materials are widely available that are relatively colorless or transparent. It is preferred however, to use a silicone that has a contrasting color to the ceramic surface being coated. This allows the thickness of the material and the thoroughness of surface coverage to be judged by color during the application step.

Although some hydrophobic materials may need to be applied only to the ceramic surface because they are difficult to remove from the exposed conductors, if the preferred types of silicone materials are used, the entire surface, including the conductors and the ceramic may be entirely coated to ensure the adequacy of the coating.

Once all ceramic surfaces have been thoroughly coated, the excess hydrophobic material is vigorously removed by wiping, however, it is expected that other removal methods may also be suitable. This removal step simultaneously removes the excess hydrophobic material from the ceramic to produce the thin final layer and cleans the conductors. The preferred material is easily removed from the conductors by wiping, but aggressively attaches itself to the clean ceramic surface, leaving a residue coating of the correct thickness. It is believed that this vigorous mechanical wiping step also aids in producing a good bond between the ceramic and the residue hydrophobic layer.

A suitable method is to wipe the hydrophobic layer with clean room paper or other non-contaminating wiper to substantially remove all of the excess material from the surface of the ceramic and from the interstices between conductors. When the preferred hydrophobic material having a contrasting color is vigorously wiped off, the conductors are substantially completely clean and the ceramic surface has a thin residue remaining that produces almost no visible color.

After coating, the hydrophobic silicone based material may be allowed to air cure at room temperature. However, it has been found that curing at a higher temperature, above 100° C., produces a superior coating. In the preferred embodiment, the hydrophobic material is oven cured at 150° C. for 15 minutes. The temperature is then raised at 10° C. per minute to 230° C. and held there for an additional 15 minutes before cooling.

The resulting hydrophobic layer is less than 1 micrometer in thickness, preferably less than 0.1 micrometer and most preferably between 0.01 and 0.001 micrometers. This extremely thin layer minimizes any electrical conduction through the layer, yet retains the hydrophobic property. Despite the fact that the layer is extremely thin, the aggressive attachment between the ceramic and the hydrophobic layer resulting from the steps above produces a coating that is resistant to hot solvents, including hot xylene used during cleaning steps associated with soldering connectors to the probe card.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
We claim:

1. An electrical probe card comprising:
   a ceramic substrate having a ceramic surface;
   a first plurality of electrical conductors formed on the ceramic surface defining a plurality of channels; and
   a coating of a hydrophobic material adhered to the ceramic surface between the electrical conductors, the coating of the hydrophobic material being adhered to the ceramic surface after the first plurality of electrical conductors has been formed on the ceramic surface.

2. An electrical probe card according to claim 1 further including a plurality of guard conductors located on the ceramic surface, each of said guard conductors actively guarding the first plurality of electrical conductors against leakage current, and the coating of hydrophobic material being applied to the ceramic surface between the guard conductors.

3. An electrical probe card according to claim 2 further including a plurality of sense conductors located on the ceramic surface, each of said sense conductors being electrically connected to a corresponding one of the first plurality of electrical conductors, and the coating of hydrophobic material being applied to the ceramic surface between the sense conductors.

4. An electrical probe card according to claim 1 wherein the hydrophobic material is a silicone based material.

5. An electrical probe card according to claim 4 wherein the hydrophobic material is a moisture activated single component silicone based material that is solvent resistant and stable at temperatures above 300° C.

6. An electrical probe card according to claim 1 wherein the hydrophobic material is an acyloxy activated silanol terminated polymethylalkyl siloxane with silica and iron oxide fillers.

7. An electrical probe card according to claim 1 wherein the hydrophobic material is Permatex high temperature silicone.

8. An electrical probe card according to claim 1 wherein the hydrophobic material is applied in a layer that is less than 1 micrometer in thickness.

9. An electrical probe card according to claim 8 wherein the hydrophobic material is applied in a layer that is less than 0.01 micrometer in thickness.

10. An electrical probe card comprising:

a ceramic substrate having a ceramic surface;

a plurality of electrical conductors mounted on the ceramic surface; and a coating of a hydrophobic material extending over the entire ceramic surface between the electrical conductors, the hydrophobic material being silicone based and solvent resistant and having a thickness of less than 0.1 micrometer;

the coating of the hydrophobic material being adhered to the ceramic surface after the first plurality of electrical conductors has been mounted on the ceramic surface.

11. An electrical probe card according to claim 10 wherein the ceramic surface is ring-shaped and the plurality of electrical conductors are arranged concentrically around the ring.

12. An electrical probe card according to claim 10 wherein the hydrophobic material is applied by first coating the ceramic surface with the hydrophobic material followed by wiping the hydrophobic material from the ceramic surface to mechanically remove substantially all of the hydrophobic material except a thin film residue adhered to the ceramic surface having a thickness of less than 0.01 micrometer.

13. A method for altering the surface of a ceramic probe card having electrical conductors on a ceramic surface of the probe card to reduce surface leakage current on the ceramic probe card when the ceramic probe card is used, the method comprising applying a hydrophobic silicone based material to the ceramic surface located between the electrical conductors on the ceramic probe card to a thickness of less than 1 micrometer.

14. A method for altering the surface of a ceramic probe card according to claim 13 wherein the step of applying the hydrophobic silicone based material comprises applying an excess of the hydrophobic silicone based material, followed by removing hydrophobic silicone based material to leave a residue thickness of less than 0.1 micrometer.

15. A method for altering the surface of a ceramic probe card according to claim 14 wherein the step of removing hydrophobic silicone based material to leave a residue thickness includes wiping the surface of the ceramic probe card.

16. A method for altering the surface of a ceramic probe card according to claim 13 wherein the hydrophobic silicone based material is solvent resistant and stable at temperatures above 300° C.

17. A method for altering the surface of a ceramic probe card according to claim 13 wherein the hydrophobic silicone based material is an acyloxy activated silanol terminated polymethylalkyl siloxane with silica and iron oxide fillers.

18. A method for altering the surface of a ceramic probe card according to claim 13 wherein the hydrophobic silicone based material is Permatex high temperature silicone.

19. A method for altering the surface of a ceramic probe card according to claim 13 further including the step of heating the hydrophobic silicone based in air.

20. A method for altering the surface of a ceramic probe card according to claim 19 wherein the step of heating the hydrophobic silicone based in air includes heating to a temperature of at least 100° C.

21. A method for altering the surface of a ceramic probe card according to claim 20 wherein the step of heating to a temperature of at least 100° C. comprises heating to a temperature of above 100° C. for a first period of time followed by heating to a temperature of above 200° C. for a second period of time.

\* \* \* \* \*